(12) United States Patent
Nakano

(10) Patent No.: US 11,069,621 B2
(45) Date of Patent: Jul. 20, 2021

(54) SEMICONDUCTOR DEVICE

(71) Applicant: FUJI ELECTRIC CO., LTD., Kanagawa (JP)

(72) Inventor: Hayato Nakano, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/429,071

(22) Filed: Jun. 3, 2019

(65) Prior Publication Data

US 2020/0006237 A1 Jan. 2, 2020

(30) Foreign Application Priority Data

Jul. 2, 2018 (JP) .............................. JP2018-126051

(51) Int. Cl.
*H01L 23/538* (2006.01)
*H01L 49/02* (2006.01)

(52) U.S. Cl.
CPC ...... *H01L 23/5386* (2013.01); *H01L 23/5383* (2013.01); *H01L 23/5389* (2013.01); *H01L 28/20* (2013.01); *H01L 28/40* (2013.01)

(58) Field of Classification Search
CPC . H01L 23/5386; H01L 23/5383; H01L 28/20; H01L 28/40; H01L 23/5389; H01L 25/162; H01L 23/64; H01L 23/50; H01L 23/5385; H01L 25/072; H01L 27/0288; H01L 27/0794; H01L 51/05; H01L 27/0623–08; H02M 7/003
See application file for complete search history.

(56) References Cited

U.S. PATENT DOCUMENTS

| 5,623,152 A | 4/1997 | Majumdar |
| 2003/0067748 A1 | 4/2003 | Tamba |
| 2012/0106220 A1* | 5/2012 | Yamaguchi ............ H05K 7/209 363/131 |
| 2013/0141871 A1 | 6/2013 | Katsuhiko |
| 2013/0277800 A1 | 10/2013 | Motohito |

(Continued)

FOREIGN PATENT DOCUMENTS

| JP | H08222728 A | 8/1996 |
| JP | 3325736 B2 | 9/2002 |
| JP | 3676719 B2 | 7/2005 |

(Continued)

OTHER PUBLICATIONS

Motonobu Joko et al."Snubber circuit to suppress the voltage ringing for SiC device" PCIM Europe 2015, May 19-21, 2015, Nuremberg, Germany, pp. 1047-1052.

*Primary Examiner* — Cuong B Nguyen

(57) ABSTRACT

Provided is a semiconductor device including an input terminal including a P terminal and an N terminal; a laminated circuit substrate connected to the input terminal; a power substrate provided above the laminated circuit substrate; a connecting section electrically connecting the laminated circuit substrate and the power substrate; a capacitor provided in a conduction path between the P terminal and the N terminal; and a resistor provided in series with the capacitor in the conduction path between the P terminal and the N terminal. The capacitor may be provided in a region where the input terminal or the connecting section is provided, in an overhead view.

12 Claims, 17 Drawing Sheets

(56) References Cited

U.S. PATENT DOCUMENTS

2018/0309438 A1    10/2018   Naotaka

FOREIGN PATENT DOCUMENTS

| JP | 2013222950 A | 10/2013 |
| JP | 2015039295 A | 2/2015 |
| JP | 2015207739 A | 11/2015 |
| JP | 5970668 B2 | 8/2016 |
| WO | 2018012122 A1 | 1/2018 |

* cited by examiner

SEMICONDUCTOR DEVICE

The contents of the following Japanese patent application(s) are incorporated herein by reference:
NO. 2018-126051 filed in JP on Jul. 2, 2018.

BACKGROUND

1. Technical Field

The present invention relates to a semiconductor device.

2. Related Art

There is conventional knowledge of providing a capacitor in a semiconductor device having a switching element, in order to reduce ringing generated when the semiconductor device is turned ON and turned OFF, as shown in Patent Documents 1, 2, and 3, for example.
Patent Document 1: Japanese Patent No. 3325736
Patent Document 2: Japanese Patent No. 5970668
Patent Document 3: Japanese Patent No. 3676719

Provided is a semiconductor device having a ringing suppression mechanism that saves space.

SUMMARY

To solve the above problem, according to a first aspect of the present invention, provided is a semiconductor device comprising an input terminal including a P terminal and an N terminal; a laminated circuit substrate connected to the input terminal; a power substrate provided above the laminated circuit substrate; a connecting section electrically connecting the laminated circuit substrate and the power substrate; a capacitor provided in a conduction path between the P terminal and the N terminal; and a resistor provided in series with the capacitor in the conduction path between the P terminal and the N terminal. The capacitor may be provided in a region where the input terminal or the connecting section is provided, in an overhead view.

The laminated circuit substrate may include a first laminated circuit substrate connected to the P terminal and a second laminated circuit substrate connected to the N terminal. The semiconductor device may further comprise a first connecting section that electrically connects the first laminated circuit substrate and the power substrate; and a second connecting section that electrically connects the second laminated circuit substrate and the power substrate.

The capacitor may be provided in the first connecting section. The resistor may be provided in the second connecting section.

The capacitor may be provided in a region where the N terminal is provided, in the overhead view.

The capacitor may be layered on the resistor.

Film thickness of the capacitor may be greater than film thickness of the resistor.

The capacitor may be provided in a region where the first connecting section is provided, in the overhead view. The resistor may be provided in a region where the second connecting section is provided, in the overhead view.

The capacitor and the resistor may be provided on the power substrate.

The semiconductor device may further comprise a case. The capacitor and the resistor may be provided inside the case.

The capacitor may be provided closer to the P terminal side than the resistor in the conduction path.

The capacitor may have an electrostatic capacitance that is greater than or equal to 1.0 [nF] and less than or equal to 8.0 [nF].

The resistor may have a resistance value that is greater than or equal to 2.0 [Ω] and less than or equal to 7.0 [Ω].

According to a second aspect of the present invention, provided is a semiconductor device comprising an input terminal including a P terminal and an N terminal; a laminated circuit substrate connected to the input terminal; a power substrate provided above the laminated circuit substrate; a capacitor provided in a conduction path between the P terminal and the N terminal; and a resistor provided in series with the capacitor in the conduction path between the P terminal and the N terminal. The capacitor and the resistor may be provided on the power substrate.

According to a third aspect of the present invention, provided is a semiconductor device comprising an input terminal including a P terminal and an N terminal; a laminated circuit substrate connected to the input terminal; a capacitor provided in a conduction path between the P terminal and the N terminal; and a resistor provided in series with the capacitor in the conduction path between the P terminal and the N terminal. The capacitor may be provided in a region where the input terminal is provided, in an overhead view.

The capacitor may be layered on the resistor.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1A:
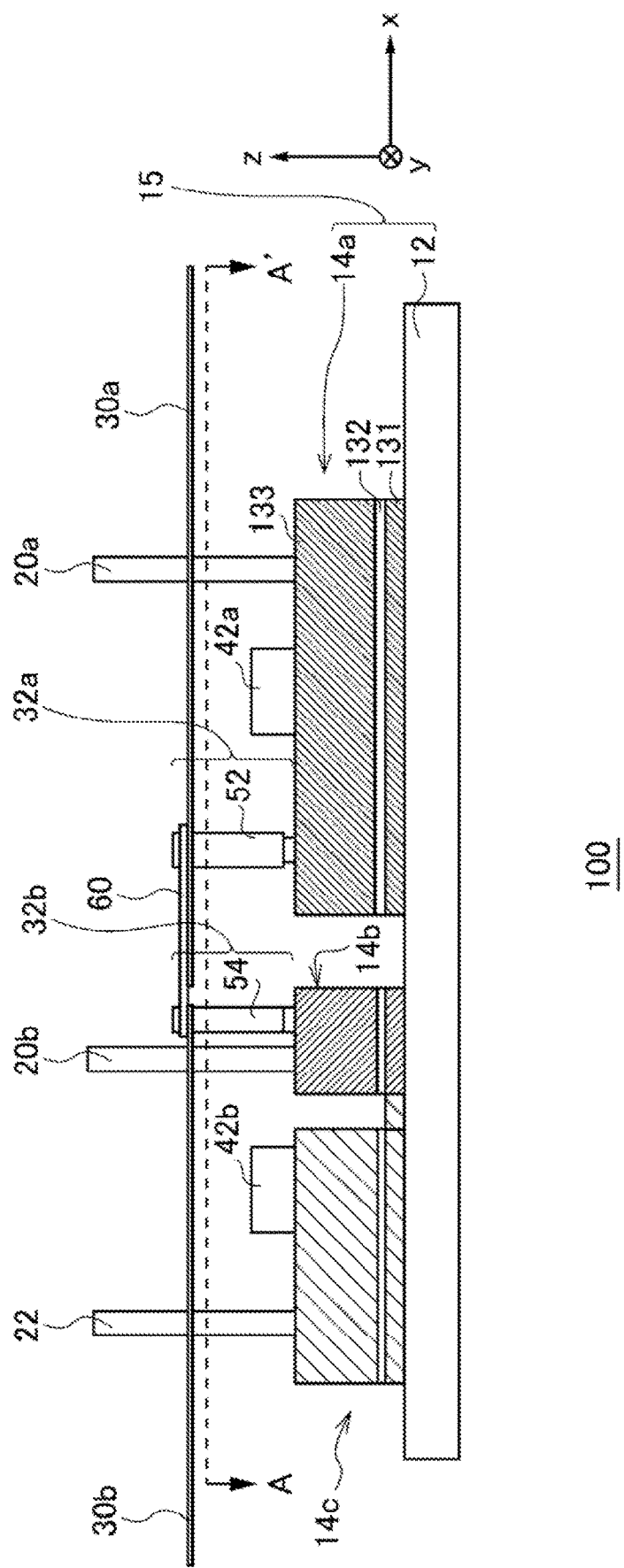
FIG. 1A is a side view of a semiconductor device 100 according to a first embodiment example.

FIG. 1A is a side view of a semiconductor device 100 according to a first embodiment example. The semiconductor device 100 of the first embodiment example includes a laminated circuit substrate 15, a power substrate 30, a connecting section 32, a semiconductor chip 42, a capacitor 52, and a resistor 54. In one example, the semiconductor device 100 has a bridge circuit and functions as a switching element. The laminated circuit substrate 15 includes an insulating board 12 and a plurality of circuit boards 14.

The longitudinal direction of the semiconductor device 100 in a plane in which the insulating board 12 extends is defined as the x-axis direction. The z axis is defined as an axis perpendicular to the x axis, and the z-axis direction is defined as a direction in which the circuit boards 14 are layered relative to the insulating board 12. The y axis is defined as an axis perpendicular to the x axis and the z axis, and the y-axis direction is a direction resulting in the xyz system being a right-handed system. In each diagram, the x, y, and z axes each express a corresponding direction.

The laminated circuit substrate 15 includes three or more circuit boards 14a, 14b, and 14c provided on the insulating board 12. As an example, the laminated circuit substrate 15 has a structure in which a ceramic substrate with good thermal conductivity, serving as the insulating board 12, and a copper foil 131, a bonding layer 132, and a copper board 133, serving as the conductive circuit boards 14, are layered in the stated order.

As an example, the laminated circuit substrate 15 may include a DCB (Direct Copper Bonding) substrate having a structure in which the copper foil 131 is layered by direct bonding to the ceramic substrate made of alumina or the like. As another example, the laminated circuit substrate 15 may include an AMB (Active Metal Brazing) substrate having a structure in which the copper foil 131 is layered by being bonded to the ceramic substrate using AMB. It should be noted that the laminated circuit substrate 15 is not limited to being a DCB substrate or AMB substrate.

The circuit board 14a is connected to an input terminal 20a. The input terminal 20a is an example of a P terminal set to a P potential. In other words, the circuit board 14a is set to the P potential. The P potential is the potential of the input terminal on the high side of the bridge circuit. The circuit board 14a of the present example is provided with a semiconductor chip 42a.

The circuit board 14b is connected to the input terminal 20b. The input terminal 20b is an example of an N terminal set to an N potential. In other words, the circuit board 14b is set to the N potential. The N potential is a potential of the input terminal on the low side of the bridge circuit. The circuit board 14b of the present example is not provided with a semiconductor chip.

The circuit board 14c is connected to an output terminal 22. The output terminal 22 is an example of a U terminal set to a U potential. The U potential is an example of a potential of the output terminal 22. The circuit board 14c is provided with a semiconductor chip 42b.

The connecting section 32a electrically connects the circuit board 14a and the power substrate 30. The connecting section 32a is an example of a first connecting section. The connecting section 32 of the present example includes the capacitor 52.

The connecting section 32b electrically connects the circuit board 14b and the power substrate 30. The connecting section 32b is an example of a second connecting section. The connecting section 32b of the present example includes the resistor 54.

The capacitor 52 is provided in a conduction path between the input terminal 20a and the input terminal 20b. In other words, the capacitor 52 is provided in the conduction path between the P terminal and the N terminal. In this way, the capacitor 52 suppresses the ringing of the semiconductor device 100. The electrostatic capacitance of the capacitor 52 is adjusted to be a value that suppresses the ringing of the semiconductor device 100.

Furthermore, the capacitor 52 is provided in the connecting section 32a. In an overhead view, the capacitor 52 is provided in the region where an input terminal 20 or a connecting section 32a is provided. The entirety of the capacitor 52 may be provided in the region where an input terminal 20 or a connecting section 32a is provided, or at least a portion of the capacitor 52 may be provided in the region where an input terminal 20 or a connecting section 32a is provided. In this way, there is no need to provide a dedicated region where the capacitor 52 is provided, so it is possible to make the semiconductor device 100 smaller. The capacitor 52 is a mica capacitor, for example. Alternatively, the capacitor 52 may be a stereoscopic ceramic capacitor or the like.

The resistor 54 is provided in a conduction path between the input terminal 20a and the input terminal 20b. In other words, the resistor 54 is provided in the conduction path between the P terminal and the N terminal. The resistor 54 is provided in series with the capacitor 52. The resistance value of the resistor 54 is adjusted to be a value that suppresses the ringing of the semiconductor device 100. The resistor 54 may be a contact resistor or a resistor formed by plating or the like.

Furthermore, the resistor 54 is provided in the connecting section 32. In other words, the resistor 54 is provided in the region where an input terminal 20 or a connecting section 32b is provided, in the overhead view. In this way, there is no need to provide a dedicated region where the resistor 54 is provided, so it is possible to make the semiconductor device 100 smaller.

The semiconductor chip 42 includes a switching element such as a MOSFET or insulated gate bipolar transistor (IGBT). Furthermore, the semiconductor chip 42 may include a free wheel diode (FWD) connected in antiparallel with the switching element. Various semiconductor substrates can be used as the substrate of the semiconductor chip 42. A silicon substrate, silicon carbide substrate, and gallium nitride substrate are examples of semiconductor substrates. The semiconductor device 100 includes a semiconductor chip 42a provided on the circuit board 14a and a semiconductor chip 42b provided on the circuit board 14c.

The power substrate 30 is provided above the laminated circuit substrate 15. The power substrate 30 has various conduction paths on the top surface thereof. As an example, the power substrate 30 includes a main current path, a gate wire, and the like, and there are cases where the power substrate 30 rises to a high temperature during operation. The power substrate 30 includes a power substrate 30a and a power substrate 30b that are separated from each other.

The bridge substrate 60 connects the power substrate 30a and the power substrate 30b. The bridge substrate 60 has a conduction path electrically connecting the connecting section 32a and the connecting section 32b.

The capacitor 52 and the resistor 54 are connected in series, via a conduction path on the bridge substrate 60. The capacitor 52 may be provided on a side of the resistor 54 closer to the input terminal 20a, which is the P terminal. In the first embodiment example, the capacitor 52 and the resistor 54 are electrically connected above the power substrate 30 by a conduction path provided on the top surface of the bridge substrate 60.

Furthermore, the structure of the capacitor 52 and the resistor 54 connected by the bridge substrate 60 does not increase the number of steps needed to mount new elements on the top surface of the power substrate 30, due to this structure itself. Yet further, since new members other than the connecting sections are not provided between the power substrate 30 and each circuit board, the resin sealing performed when resin sealing the laminated circuit substrate is not impaired.

The semiconductor chip 42a and the semiconductor chip 42b operate as switching elements. The semiconductor chip 42a and the semiconductor chip 42b have a parasitic capacitance and a parasitic inductance, and generate ringing noise in the voltage and current when turned ON and turned OFF.

The ringing noise is noise that appears as damped oscillation of a signal value around a steady value when the semiconductor circuit is turned ON and turned OFF, due to the effects of the parasitic capacitance and the parasitic inductance. When the generated ringing noise has a large value, a large overcurrent or overvoltage occurs at an initial value of oscillation, which along with the electromagnetic waves generated from the oscillation, wears down the elements of the semiconductor chip 42a and the semiconductor chip 42b, and therefore the ringing noise is preferably suppressed.

The capacitor 52 and the resistor 54 provided in series functions as a CR snubber circuit. The capacitor 52 and the resistor 54 weakens the ringing noise generated in the current and voltage between the terminals of the switching element.

The semiconductor device 100 of the present example weakens the ringing noise by including the capacitor 52 and the resistor 54 connected in series. Furthermore, by providing the capacitor 52 and the resistor 54 in the region where an input terminal 20 or a connecting section 32 is provided, in the overhead view, the semiconductor device 100 can be made smaller.

Figure 1B:
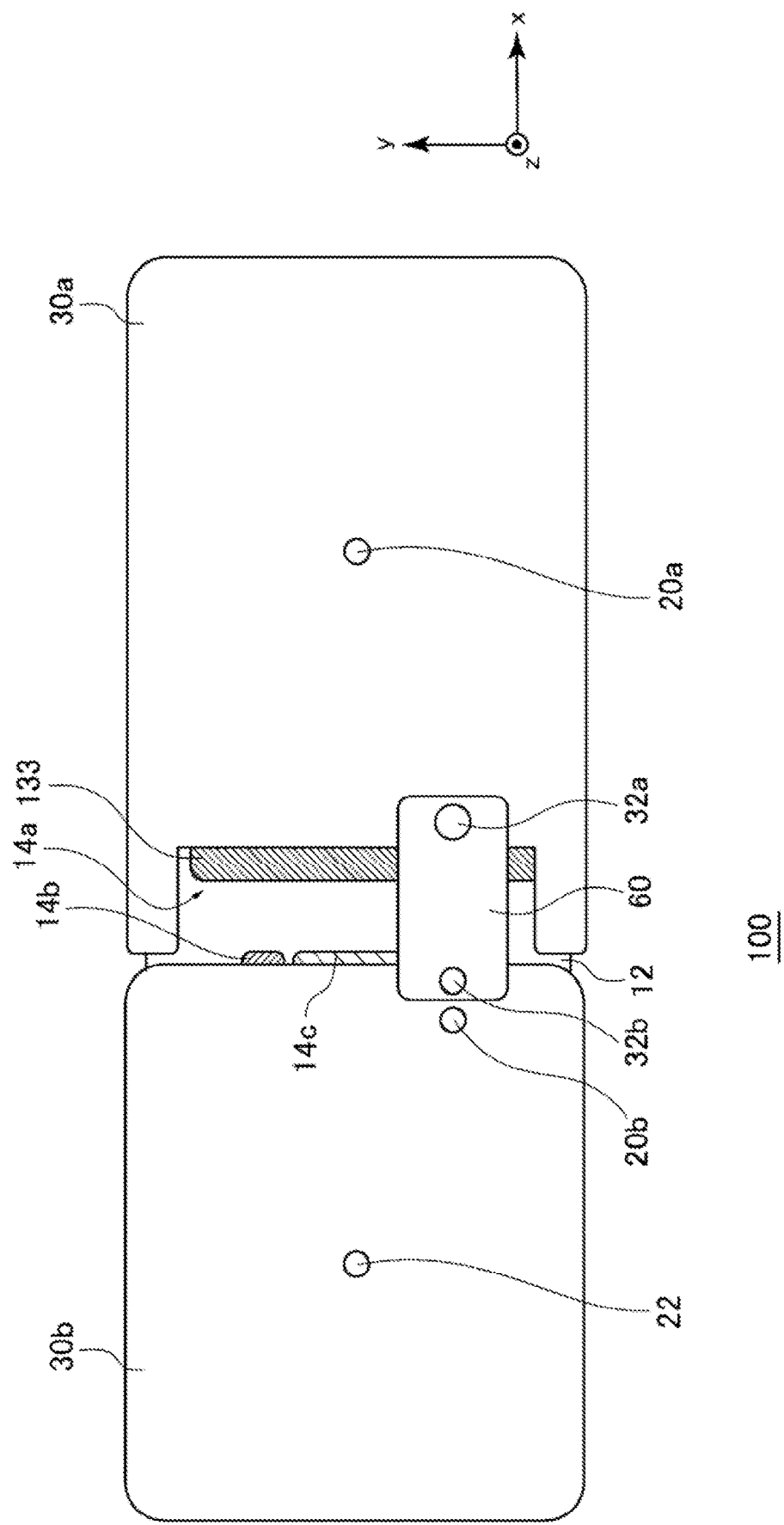
FIG. 1B is an overhead view of the semiconductor device 100 according to the first embodiment example.

FIG. 1B is an overhead view of the semiconductor device 100 according to the first embodiment example. The power substrate 30 in the first embodiment example is separated into the power substrate 30a and the power substrate 30b. As another example, the power substrate 30 does not need to be separated.

The power substrate 30a has a substantially rectangular shape. The power substrate 30b has a substantially rectangular shape. The power substrate 30a includes two protrusions protruding toward the power substrate 30b at the y-direction end portions. It should be noted that the shape of the power substrate 30 is not limited to the shape shown in FIG. 1B.

The bridge substrate 60 provides a connection between the power substrate 30a and the power substrate 30b. The connecting section 32a and the connecting section 32b are provided at respective end portions of the bridge substrate 60. The bridge substrate 60 has a conduction path for electrically connecting the connecting section 32a and the connecting section 32b.

The capacitor 52 is provided in a region where a connecting section 32 is provided, in the overhead view. Since there is no need for a new footprint for installing the capacitor 52, the degree of integration of the semiconductor device 100 remains high, and the ringing can be suppressed while maintaining the overall size.

Figure 1C:
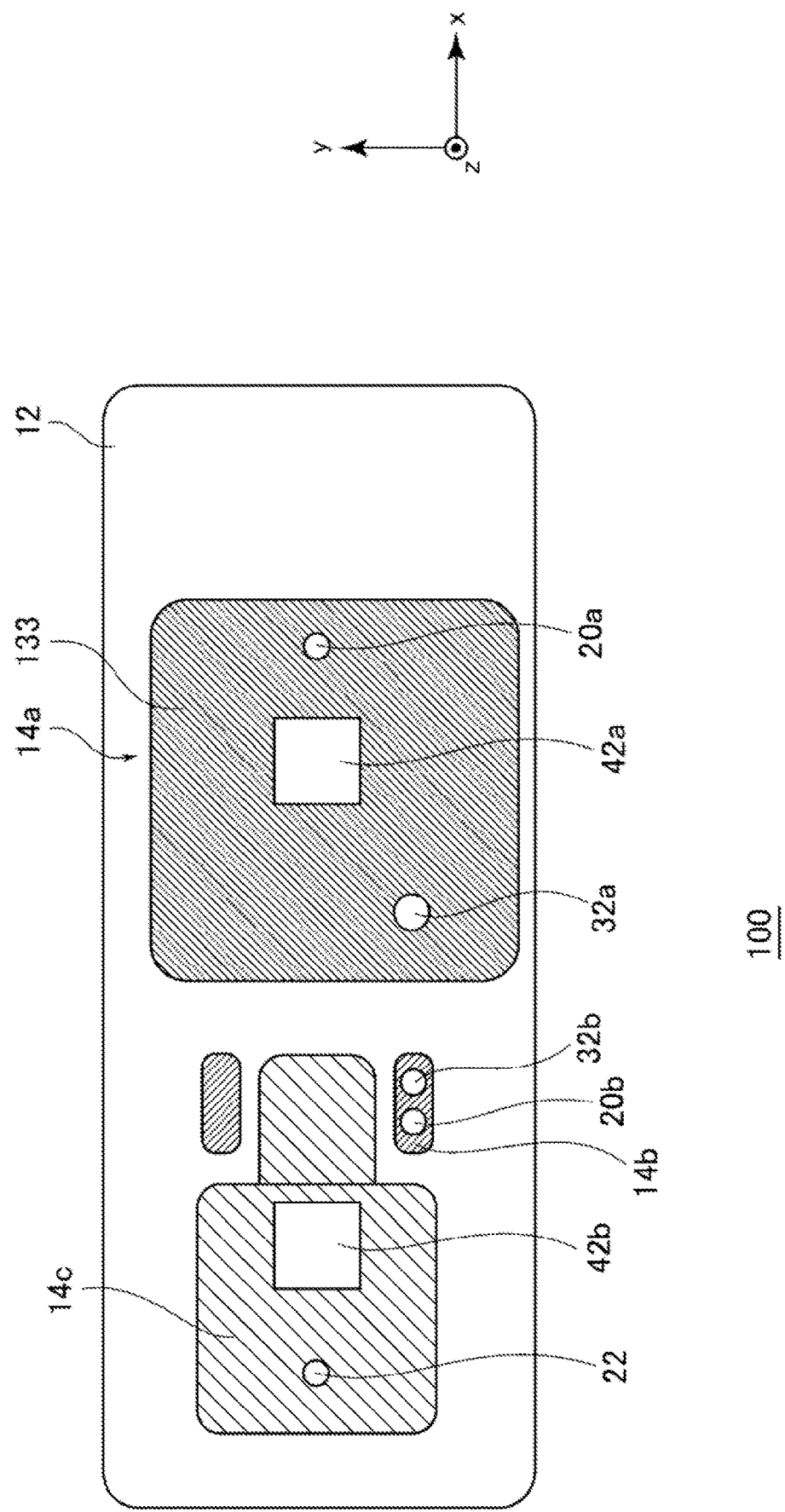
FIG. 1C shows a cross section over the line A-A' of the semiconductor device 100 according to the first embodiment example.

FIG. 1C shows a cross section over the line A-A' of the semiconductor device 100 according to the first embodiment example. The circuit board 14a, the circuit board 14b, and the circuit board 14c are provided on the top surface of the insulating board 12. The circuit board 14b does not need to be provided with a semiconductor chip 42.

Figure 2:
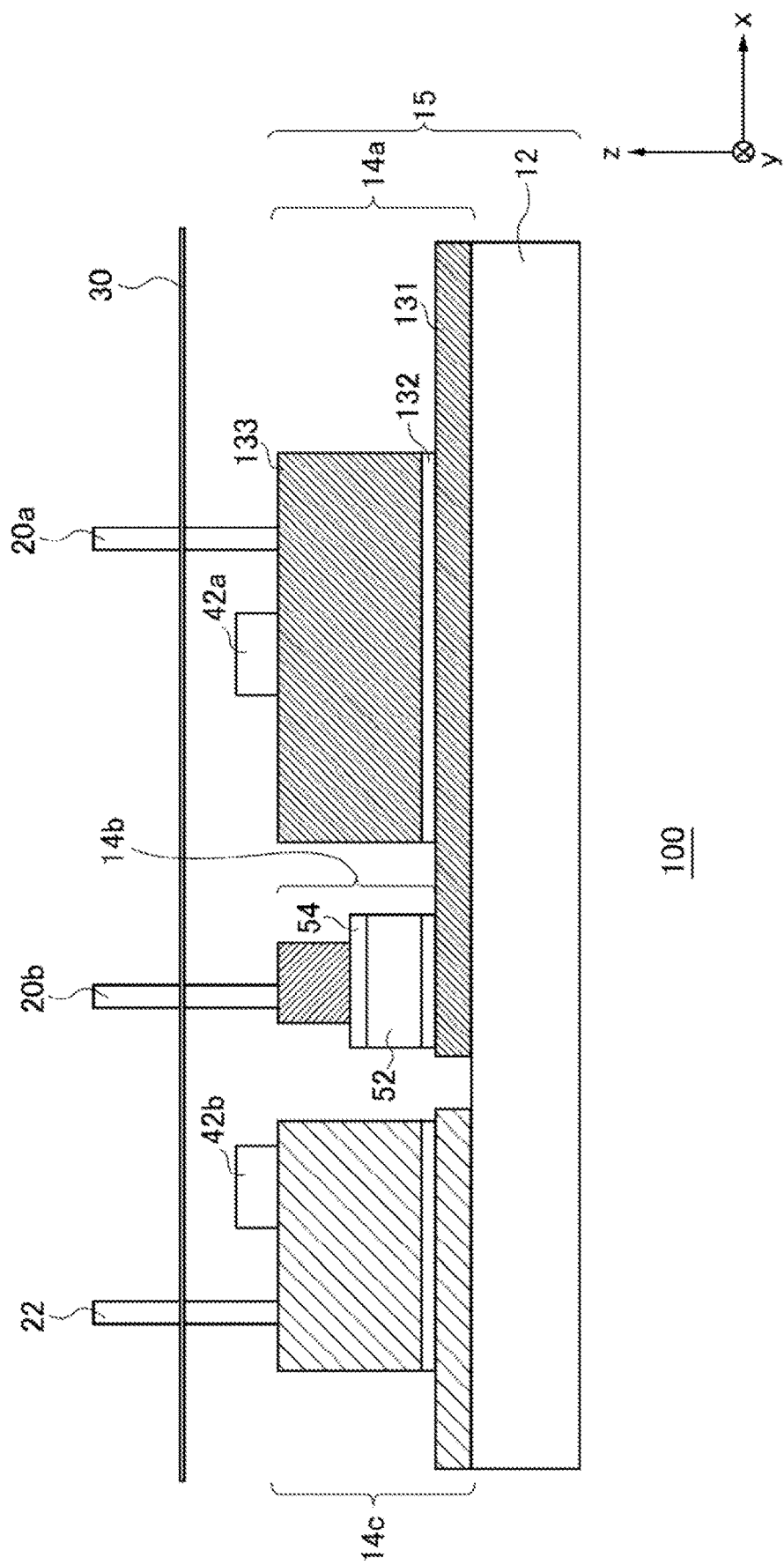
FIG. 2 is a side view of a semiconductor device 100 according to a second embodiment example.

FIG. 2 is a side view of a semiconductor device 100 according to a second embodiment example. The semiconductor device 100 of the second embodiment example differs from the semiconductor device 100 according to the first embodiment example in that the layered capacitor 52 and resistor 54 are included in the circuit board 14b. In the present example, the description focuses on points different from the first embodiment example. In FIG. 2, the connecting section 32 is not shown in the drawing, but the connecting section 32 may be provided as needed.

The circuit board 14a is set to the P potential. The circuit board 14a is provided with the semiconductor chip 42a.

The circuit board 14b is provided above a metal layer, such as a copper pattern, set to the P potential of the circuit board 14a. The circuit board 14b includes the capacitor 52 and the resistor 54.

The circuit board 14c is provided with the semiconductor chip 42b. The circuit board 14c may be electrically connected to the circuit board 14a and the circuit board 14b.

The capacitor 52 is provided in the region where the input terminal 20b is provided, in the overhead view. Therefore, there is no need to provide a dedicated region where the capacitor 52 is provided, and it is possible to make the semiconductor device 100 smaller.

The resistor 54 is provided in the region where the input terminal 20b is provided, in the overhead view. Therefore, there is no need to provide a dedicated region where the resistor 54 is provided, and it is possible to make the semiconductor device 100 smaller. For example, the resistor 54 is provided by providing a resistance composition such as impurities in the copper pattern of the circuit board 14b.

The capacitor 52 of the present example is layered on the resistor 54. A capacitor packaged with a planar shape is used as the capacitor 52.

The film thickness of the capacitor 52 may be greater than the film thickness of the resistor 54. For example, in a case where the capacitor 52 is a ceramic capacitor or the like and the resistor 54 is provided by providing a resistance composition such as impurities in the metal layer such as the copper pattern, the film thickness of the capacitor 52 is greater than the film thickness of the resistor 54. However, the film thickness of the capacitor 52 may instead be less than the film thickness of the resistor 54. The capacitor 52 is electrically connected at the top surface and bottom surface thereof by soldering.

The capacitor 52 is provided on the input terminal 20a side of the resistor 54 in the conduction path between the input terminal 20a and the input terminal 20b. In other words, the capacitor 52 is provided on the P terminal side of the resistor 54 in the conduction path between the P terminal and the N terminal.

The capacitor 52 of the present example is provided near the center of the semiconductor device 100. Being provided near the center of the semiconductor device 100 means, for example, being provided in the same region as the region where the input terminal 20b is provided, in the overhead view, in a case where the input terminal 20b is provided between the input terminal 20a and the output terminal 22. In this way, it is possible to reduce thermal deformation of the semiconductor device 100 caused by the heat generated in the device, and to increase the reliability of the device.

Figure 3A:
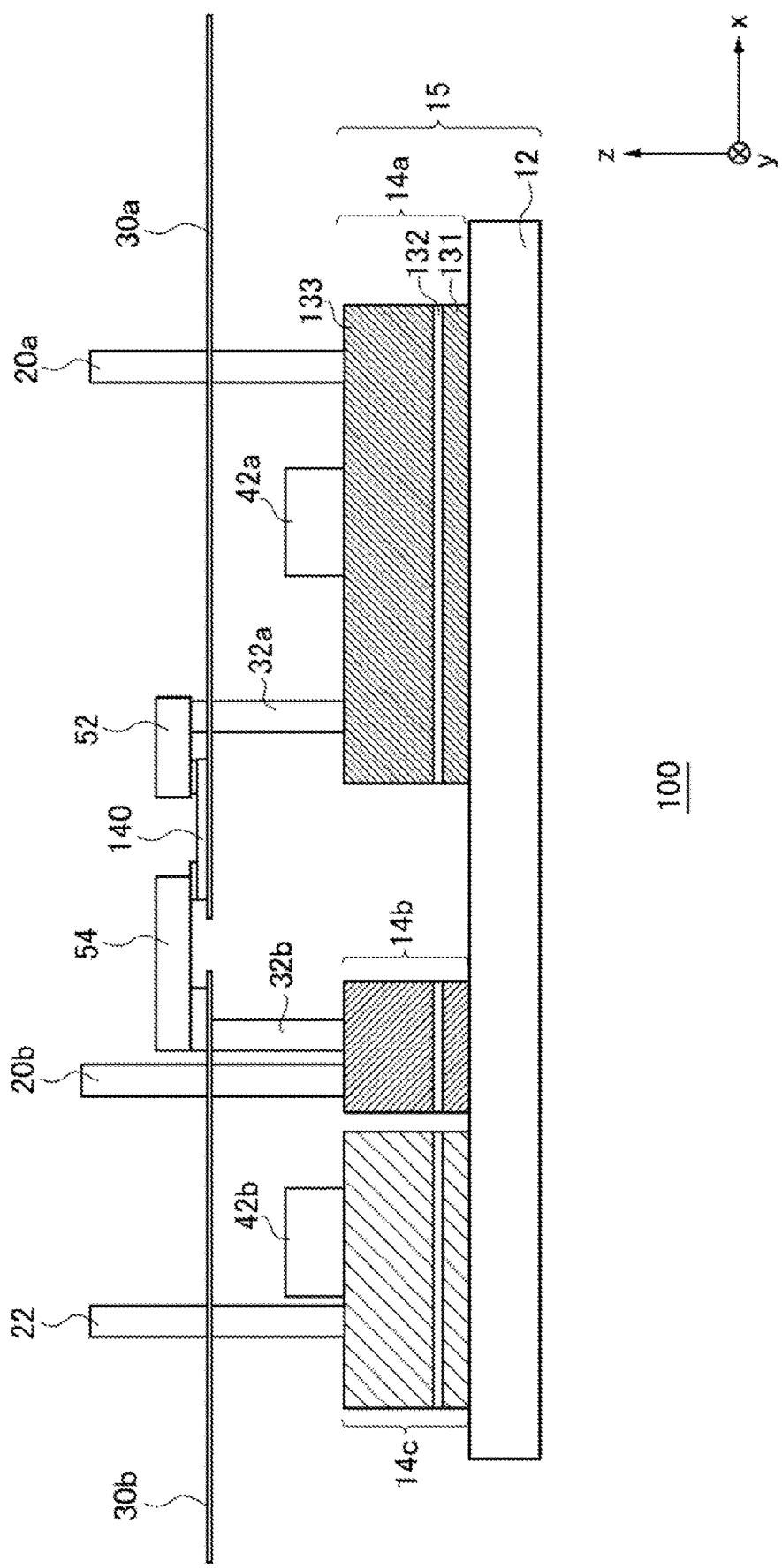
FIG. 3A is a side view of a semiconductor device 100 according to a third embodiment example.

FIG. 3A is a side view of a semiconductor device 100 according to a third embodiment example. The semiconductor device 100 of the third embodiment example includes the insulating board 12, the laminated circuit substrate 15, the power substrate 30, and the connecting section 32. In the present example, the description focuses on points different from the first embodiment example.

The capacitor 52 is provided on the power substrate 30. By providing the capacitor 52 on the power substrate 30, the degree of freedom for the wiring is improved. The capacitor 52 may be provided in the region where the connecting section 32a is provided, in the overhead view.

The resistor 54 is provided on the power substrate 30. Since the resistor 54 can be provided on the power substrate 30, the degree of freedom for the wiring is improved. As an example, the resistor 54 may be provided in the region where the connecting section 32b is provided, in the overhead view.

The semiconductor chip 42a is provided on the top surface of the circuit board 14a. The semiconductor chip 42b is provided on the circuit board 14c.

The input terminal 20b that is the N potential and the connecting section 32b are provided above the circuit board 14b. The circuit board 14b is set to the N potential by the input terminal 20b, and the connecting section 32b is connected to the resistor 54 via a conductive member.

The semiconductor chip 42b is provided on the top surface of the circuit board 14c. The terminal on one side of the semiconductor chip 42b is connected to the conduction path from the circuit board 14a, and this terminal is also connected to the output terminal 22 that is the U terminal.

As an example, the other terminal of the semiconductor chip 42b is connected through the input terminal 20b that is the N terminal through the circuit board 14b, via a conduction path provided on the insulating board 12. As another example, the other terminal of the semiconductor chip 42b may be connected to the N terminal via the power substrate 30.

As an example, the resistor 54 bridges the space between the power substrate 30a and the power substrate 30b. It should be noted that the resistor 54 may be replaced with another element that bridges the space between the power substrate 30a and the power substrate 30b, as long as a conduction path via the capacitor 52 and the resistor 54 is provided from the connecting section 32a to the connecting section 32b.

A connection pad 140 has a conduction path connecting the capacitor 52 and the resistor 54. The connection pad 140 is provided on the top surface of the power substrate 30a. Instead, the connection pad 140 may be provided on the top surface of the power substrate 30b.

Furthermore, the conduction path between the capacitor 52 and the resistor 54 may be provided without using the connection pad 140. In the present example, the capacitor 52 and the resistor 54 are arranged above the connection pad 140, with a conductive member interposed therebetween.

The power substrate 30 includes the power substrate 30a and the power substrate 30b separated from each other. However, the configuration of the power substrate 30 is not limited to this. The power substrate 30 has various conduction paths on the top surface thereof. As an example, the power substrate 30 includes a main current path for supplying power to the semiconductor chip 42a, a gate wire, and the like.

Figure 3B:
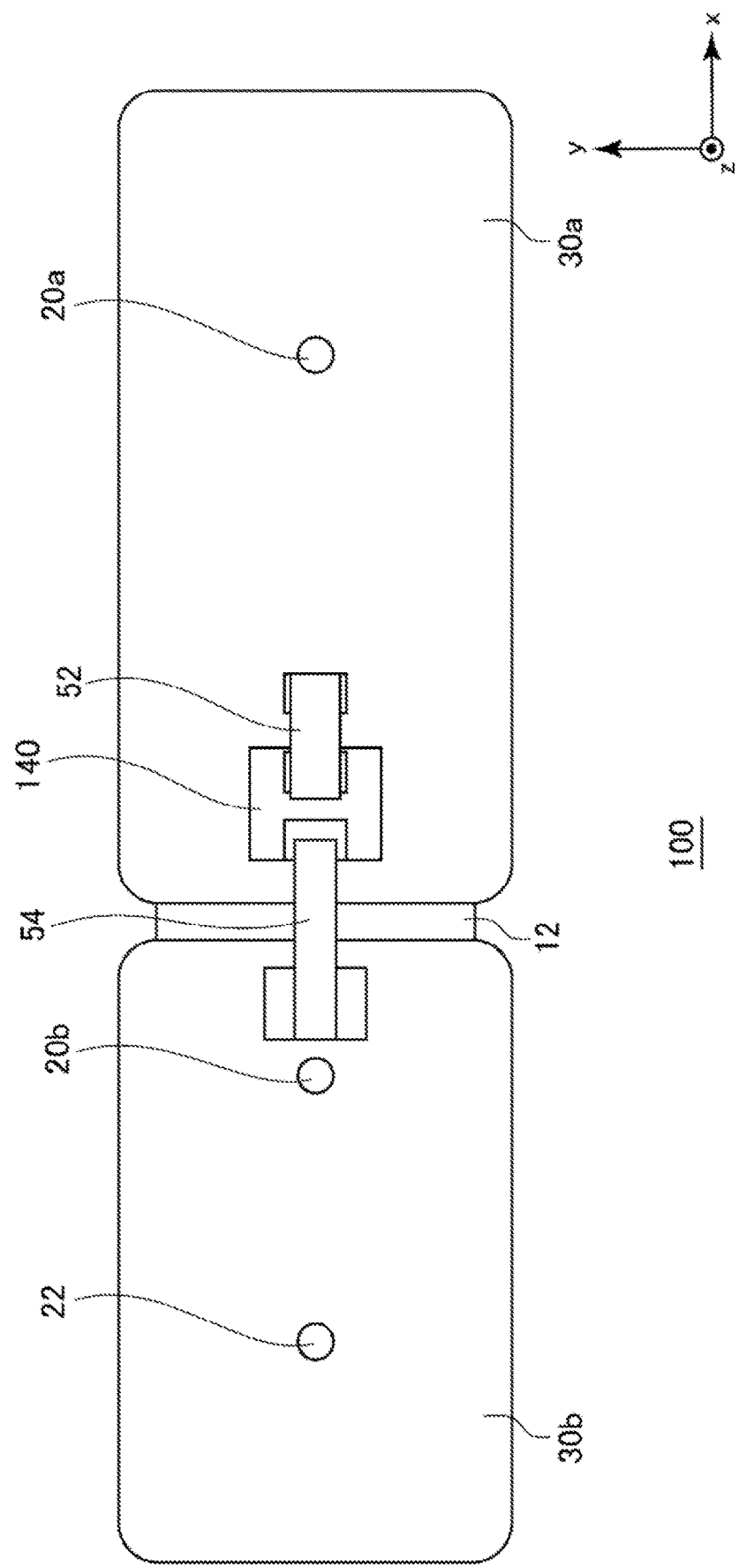
FIG. 3B is an overhead view of the semiconductor device 100 according to the third embodiment example.

FIG. 3B is an overhead view of the semiconductor device 100 according to the third embodiment example. The power substrate 30 includes the power substrate 30a with a substantially rectangular shape and the power substrate 30b with a substantially rectangular shape. The shapes of the power substrate 30a and the power substrate 30b are not limited to the shapes of the present example. The connection pad 140 has a conduction path formed between the connecting section 32a and the connecting section 32b. The capacitor 52 and the resistor 54 are provided in this conduction path.

Figure 4A:
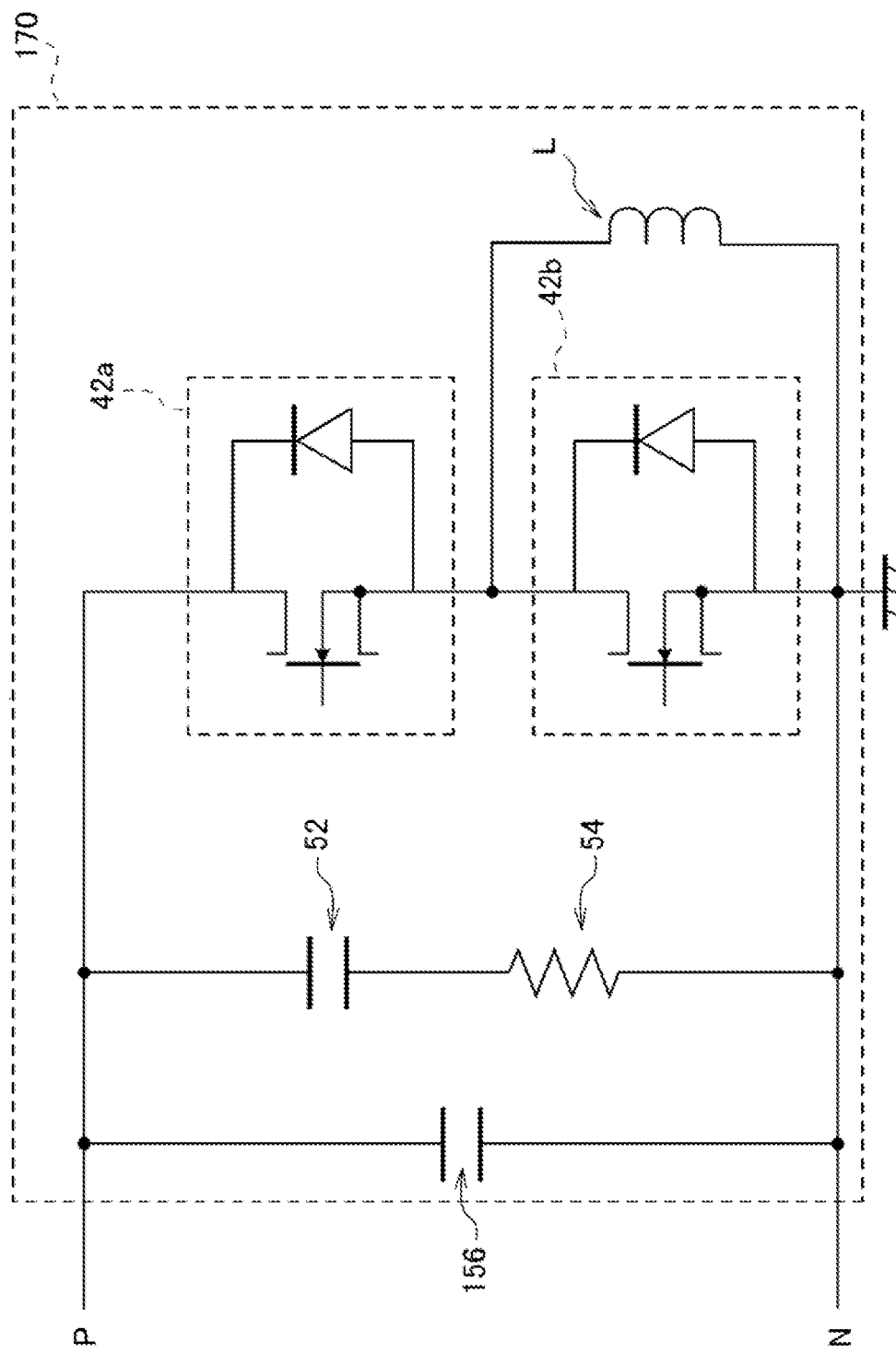
FIG. 4A is a circuit diagram of an equivalent circuit of the semiconductor device 100 according to an embodiment example.

FIG. 4A is a circuit diagram of an equivalent circuit of the semiconductor device 100 according to an embodiment example. The semiconductor device 100 includes the semiconductor chips 42, the capacitor 52, and the resistor 54.

The capacitor 52 is connected in series with the resistor 54 between the P terminal and the N terminal. The capacitor 52 is provided on the P terminal side of the resistor 54.

The semiconductor chip 42a and the semiconductor chip 42b operate as switching elements. The semiconductor chip 42a and the semiconductor chip 42b have a parasitic inductance L, and cause ringing when the circuit is turned ON and turned OFF.

A capacitor 156 is provided between the P terminal and the N terminal. The capacitor 156 suppresses the ringing By having the capacitor 52 and the resistor 54 provided in parallel with the capacitor 156, the semiconductor device 100 can reduce the ringing when turned ON and turned OFF.

A case 170 houses the semiconductor device 100. The capacitor 52 and the resistor 54 are provided inside the case 170. On the other hand, the capacitor 156 may be provided outside the case 170.

Figure 4B:
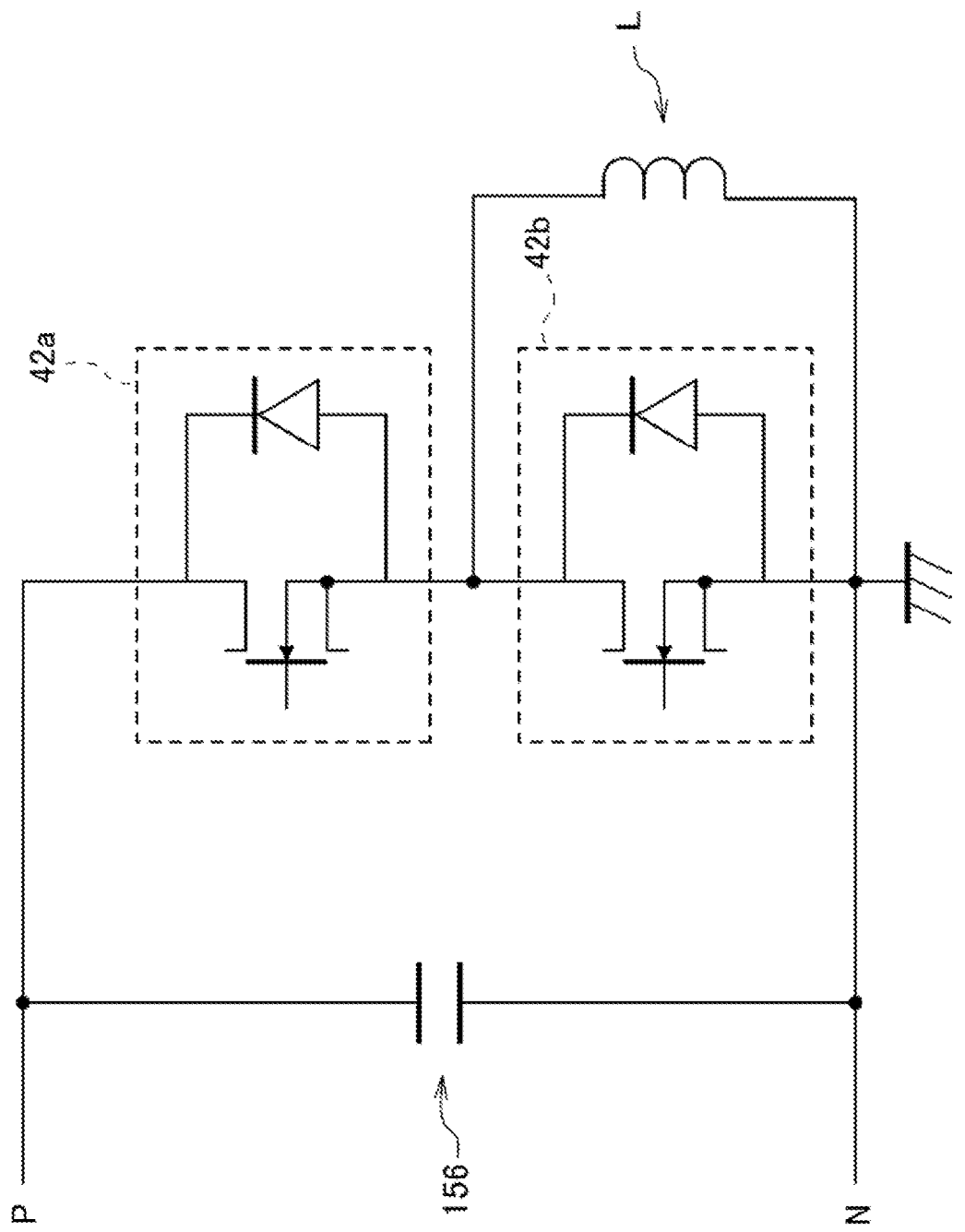
FIG. 4B is a circuit diagram of a semiconductor device 500 according to a comparative example.

FIG. 4B is a circuit diagram of a semiconductor device 500 according to a comparative example. The semiconductor device 500 differs from the semiconductor device 100 according to the embodiment example by not including the capacitor 52 and the resistor 54. The semiconductor device 500 includes the capacitor 156 but does not include the capacitor 52 and the resistor 54, and therefore cannot sufficiently reduce the ringing.

Figure 5A:
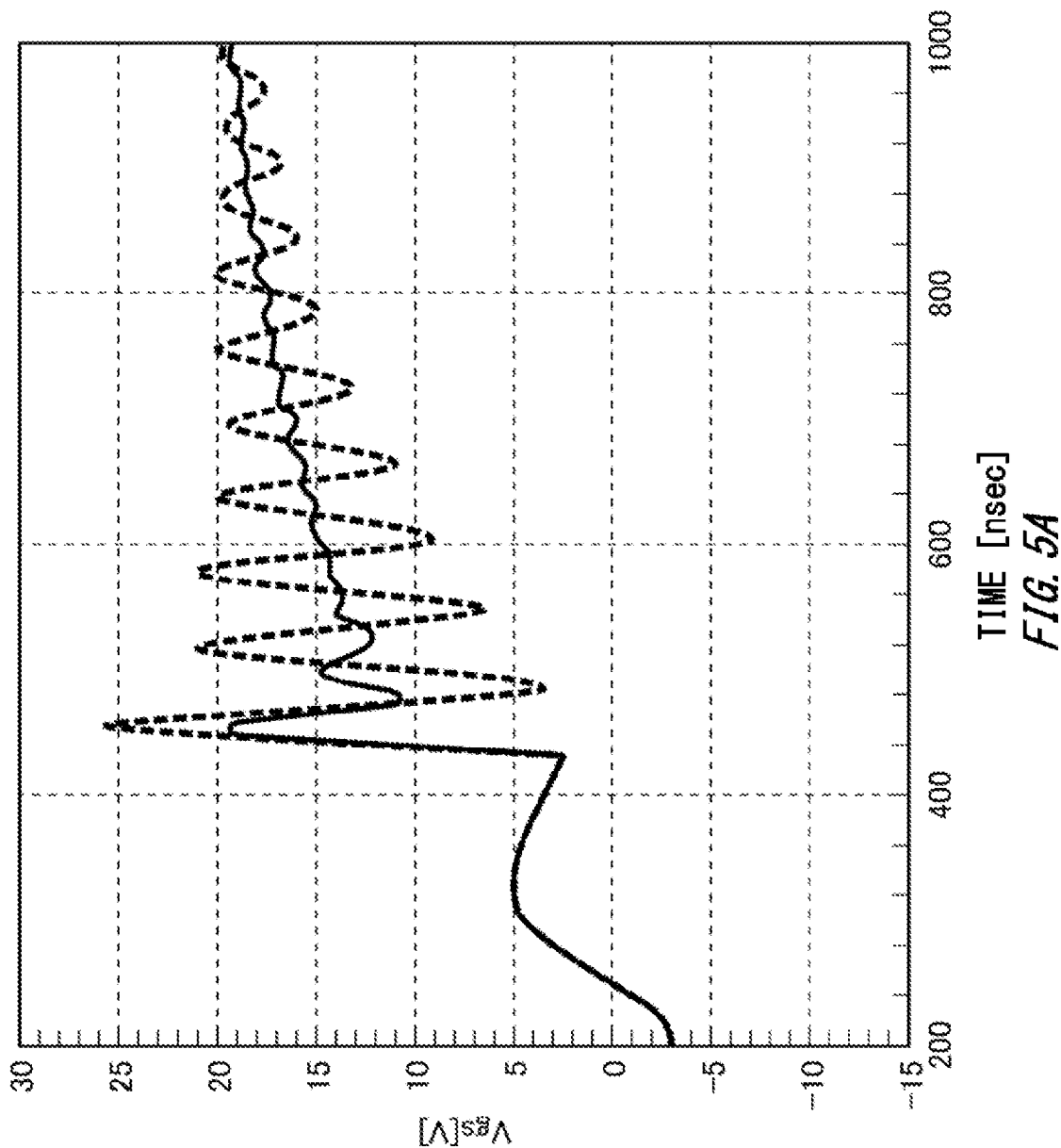
FIG. 5A is a diagram of a comparison between an embodiment example and the comparative example regarding the gate-source voltage $V_{gs}$ when turn-ON occurs.

FIG. 5A is a diagram of a comparison between an embodiment example and the comparative example regarding the gate-source voltage $V_{gs}$ when turn-ON occurs. The curve shown by the solid line is the change over time of the gate-source voltage $V_{gs}$ of the semiconductor device 100 according to the embodiment example when the semiconductor device 100 is turned ON. The curve shown by the dashed line is the change over time of the gate-source voltage $V_{gs}$ of the semiconductor device 500 according to the comparative example when the semiconductor device 500 is turned ON.

From FIG. 5A, it is understood that the curve according to the comparative example has ringing noise oscillation that lasts longer than the ringing noise oscillation of the curve according to the embodiment example. In the embodiment example, the oscillation is very small after 500 [nsec], and the ringing noise is suppressed.

Figure 5B:
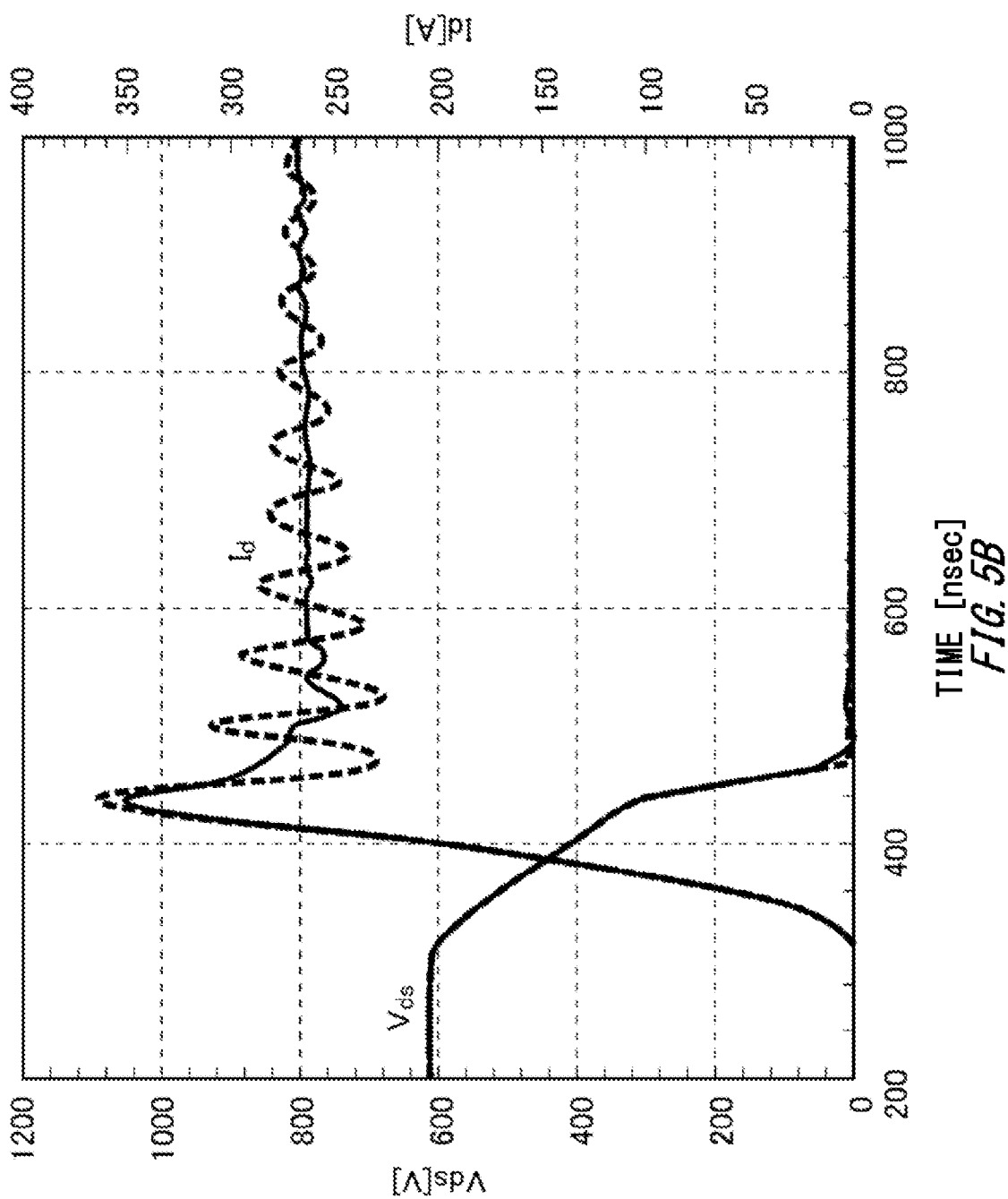
FIG. 5B is a diagram of a comparison between an embodiment example and the comparative example regarding the drain-source voltage $V_{ds}$ and the drain current $I_d$ when the turn-ON occurs.

FIG. 5B is a diagram of a comparison between an embodiment example and the comparative example regarding the drain-source voltage $V_{ds}$ and the drain current $I_d$ when turn-ON occurs. The curve shown by the solid line is the change over time of the drain-source voltage $V_{ds}$ and the drain current $I_d$ of the semiconductor device 100 according to the embodiment example when the semiconductor device 100 is turned ON. The curve shown by the dashed line is the change over time of the drain-source voltage $V_{ds}$ and the drain current $I_d$ of the semiconductor device 500 according to the comparative example when the semiconductor device 500 is turned ON.

For both the embodiment example and the comparative example, when the semiconductor device is turned ON, the ringing noise has very little effect on $V_{ds}$, and significant oscillation is not seen. On the other hand, oscillation caused by the ringing noise is seen in $I_d$. In the comparative example, the oscillation in the $I_d$ curve lasts a long time, while in the embodiment example, after 500 [nsec], the oscillation is eliminated from the $I_d$ curve and the ringing is effectively suppressed.

Figure 6A:
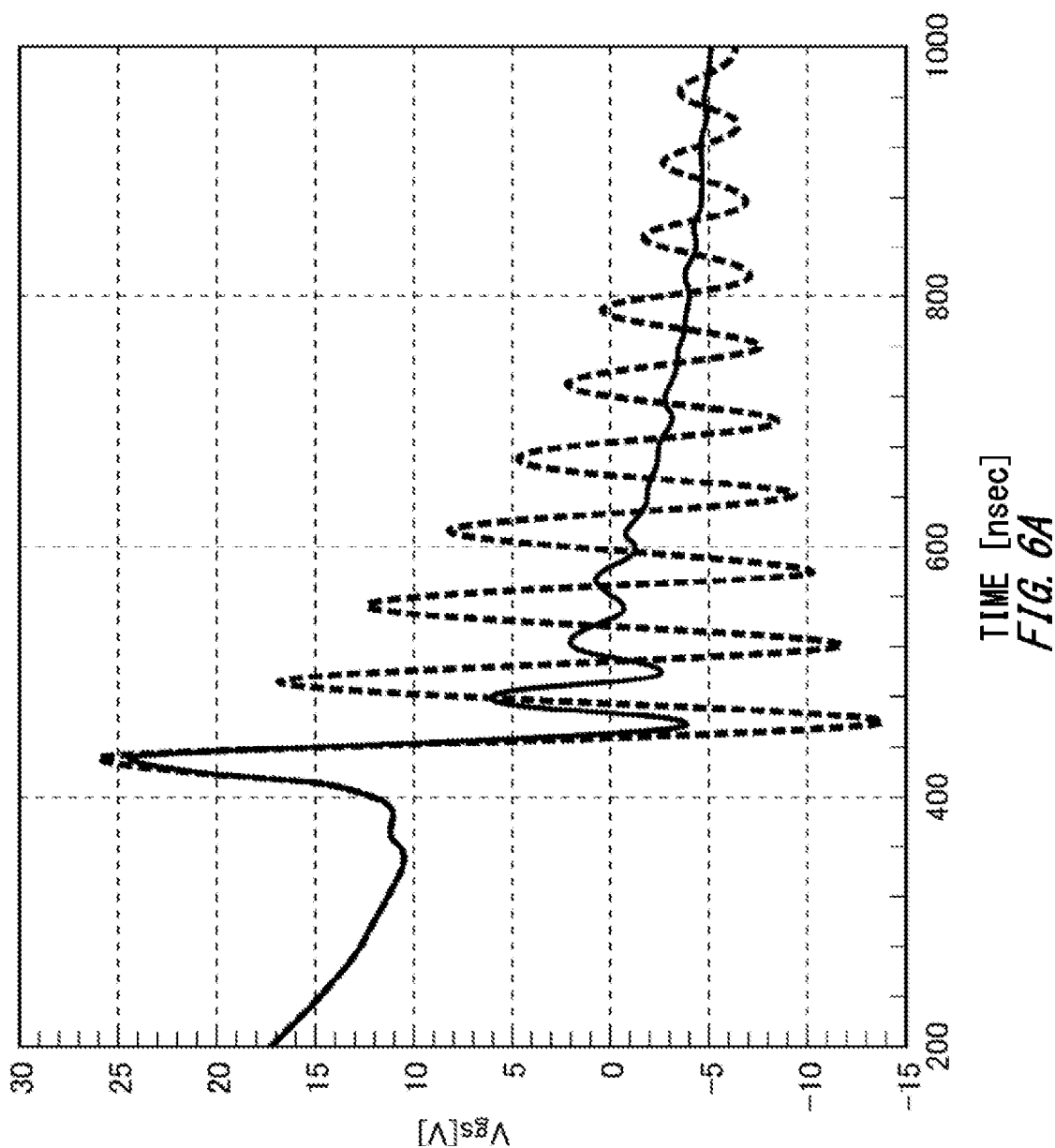
FIG. 6A is a diagram of a comparison between an embodiment example and the comparative example regarding the gate-source voltage $V_{gs}$ when turn-OFF occurs.

FIG. 6A is a diagram of a comparison between the embodiment example and the comparative example regarding the gate-source voltage $V_{gs}$ when turn-OFF occurs. The curve shown by the solid line is the change over time of the gate-source voltage Vgs according to the embodiment example when turn-OFF occurs, and the curve shown by the dashed line is the change over time of the gate-source voltage Vgs according to the comparative example when turn-OFF occurs.

It can be seen that, compared to when the semiconductor devices are turned ON, the amplitude of the oscillation caused by the ringing has a larger value. In other words, the effect of the ringing noise when a semiconductor device is turned OFF is greater than the effect of the ringing noise when the semiconductor device is turned ON.

In the comparative example, the amplitude is attenuated in a range up to 1000 [nsec], but the $V_{gs}$ curve continues to oscillate. In the embodiment example, the ringing is effectively suppressed, and the $V_{gs}$ curve exhibits almost no oscillation after 600 [nsec]. By providing both the capacitor 52 and the resistor 54 as in the embodiment example, it is possible to advantageously eliminate the ringing noise.

Figure 6B:
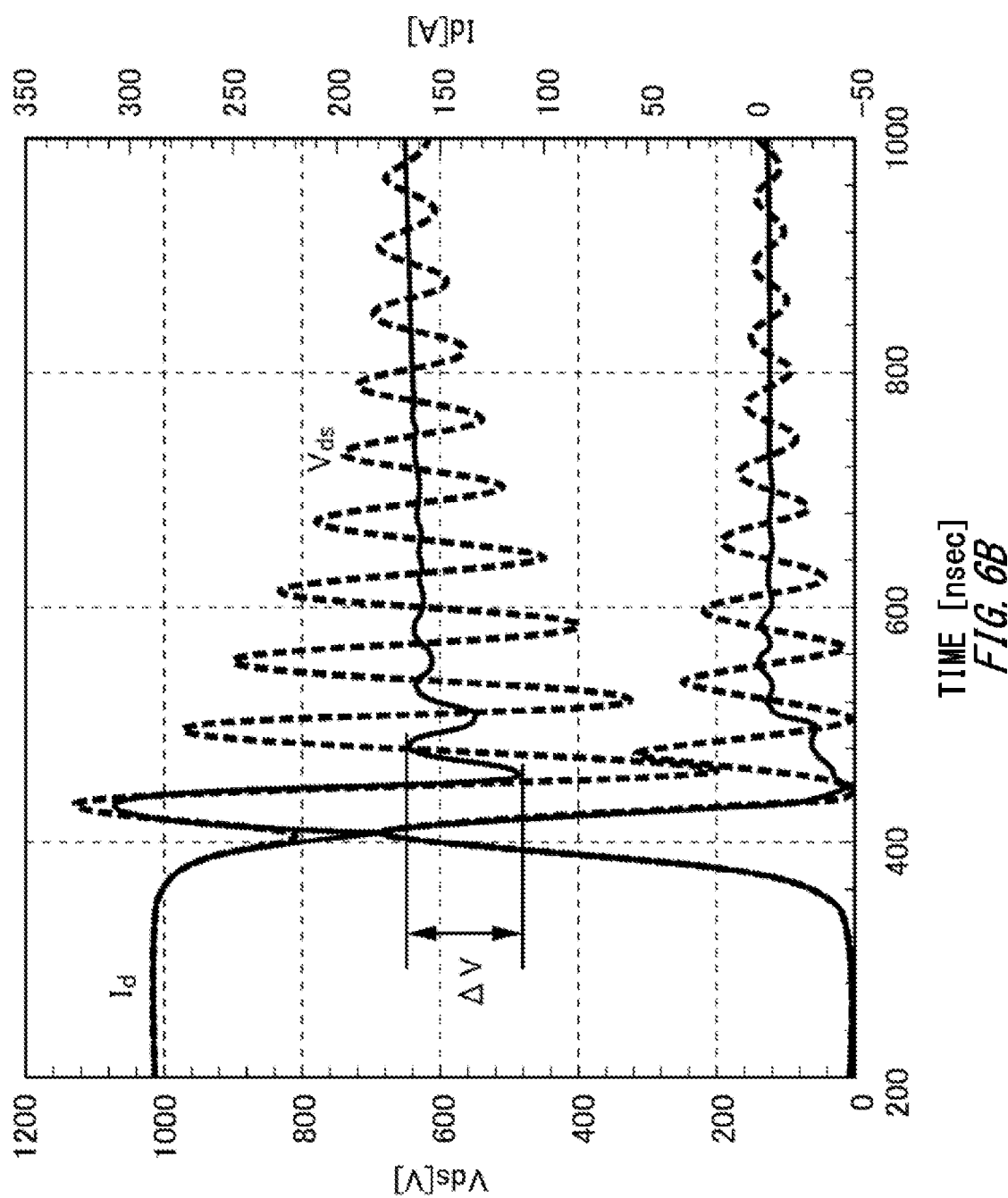
FIG. 6B is a diagram of a comparison between an embodiment example and the comparative example regarding the drain-source voltage $V_{ds}$ and the drain current $I_d$ when turn-OFF occurs.

FIG. 6B is a diagram of a comparison between an embodiment example and the comparative example regarding the drain-source voltage $V_{ds}$ and the drain current $I_d$ when turn-OFF occurs. The curve shown by the solid line is the change over time of the drain-source voltage $V_{ds}$ and the drain current $I_d$ according to the embodiment example when turn-OFF occurs, and the curve shown by the dashed line is the change over time of the drain-source voltage $V_{ds}$ and the drain current $I_d$ according to the comparative example when turn-OFF occurs.

The difference between a first local minimum voltage value and a local maximum voltage value that appears following the first local minimum voltage value in $V_{ds}$ when a turn-OFF occurs is defined as the surge voltage $\Delta V$. The value of the surge voltage $\Delta V$ is an index that characterizes the magnitude of the oscillation of the voltage caused by the ringing. The magnitude of the surge voltage $\Delta V$ determines an initial oscillation value of the attenuated oscillation noise. In other words, the larger the value of the surge voltage $\Delta V$, the greater the effect of the oscillation noise caused by the ringing.

In the curve showing $V_{ds}$ according to the comparative example, the surge voltage $\Delta V$ has a large value, and the curve of $V_{ds}$ continues to oscillate in a range up to 1000 [nsec]. On the other hand, the curve of $V_{ds}$ according to the embodiment example has the ringing effectively eliminated therefrom, and exhibits almost no oscillation after 600 [nsec].

When turn-OFF occurs, oscillation of the $I_d$ curve is seen in the comparative example, and ringing noise occurs. In the embodiment example, fluctuation occurs near the local minimum value of the $I_d$ curve, but the ringing noise is suppressed more than in the comparative example, and no large waves are observed in the curve.

In the manner described above, when turn-OFF occurs, oscillation is seen in both $V_{ds}$ and $I_d$ in the comparative example. When turn-OFF occurs, the effect of ringing is greater than when turn-ON occurs, and it is difficult to suppress the ringing with the circuit of the comparative example. On the other hand, with the circuit of the embodiment example, the ringing is effectively suppressed.

Figure 7:
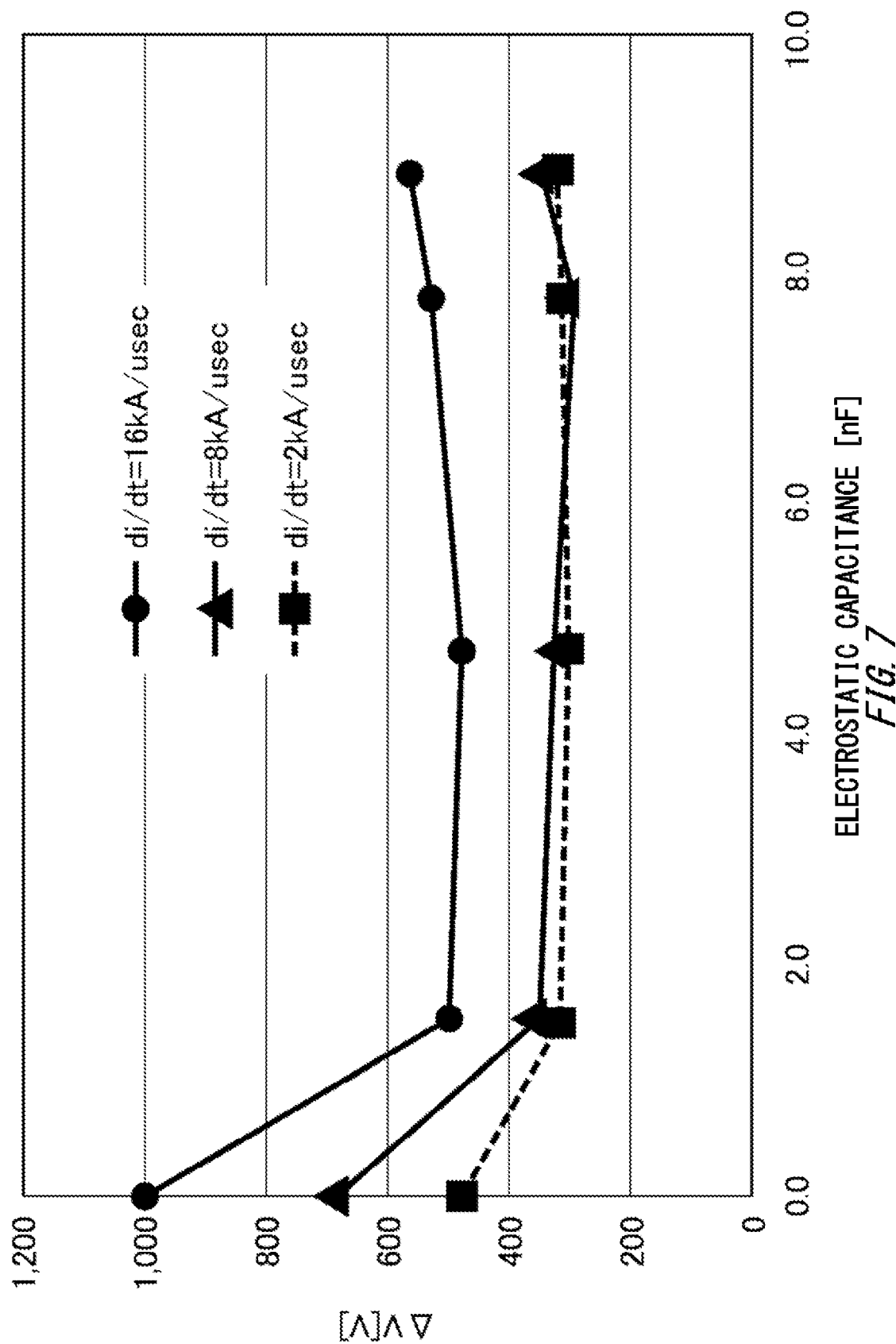
FIG. 7 is a graph showing change of the magnitude of the surge voltage ΔV with respect to change of the magnitude of the electrostatic capacitance of the capacitor 52.

FIG. 7 is a graph showing change of the magnitude of the surge voltage $\Delta V$ with respect to change of the magnitude of the electrostatic capacitance of the capacitor 52. The graph of the present example shows the change of the surge voltage $\Delta V$ in a case where the electrostatic capacitance of the capacitor 52 is changed from 0 [nF] to 8.8 [nF]. The resistance value of the resistor 54 is fixed at 3.9[Ω]. The curves correspond respectively to cases where the switching speed di/dt of the semiconductor device 100 is changed at the three stages of 2 [kA/µsec], 8 [kA/µsec], and 16 [kA/µsec].

By suitably setting the electrostatic capacitance of the capacitor 52, it is possible to reduce the surge voltage $\Delta V$. For example, the surge voltage $\Delta V$ is suppressed when the electrostatic capacitance of the capacitor 52 is in a range of greater than or equal to 1.0 [nF] and less than or equal to 8.0 [nF]. Accordingly, it is possible to suppress the ringing by giving the capacitor 52 an electrostatic capacitance that is greater than or equal to 1.0 [nF] and less than or equal to 8.0 [nF]. Furthermore, an element with a switching speed di/dt that is greater than or equal to 2 [kA/µsec] and less than or equal to 16 [kA/µsec] may be used as the switching element mounted in each semiconductor chip 42.

Figure 8:
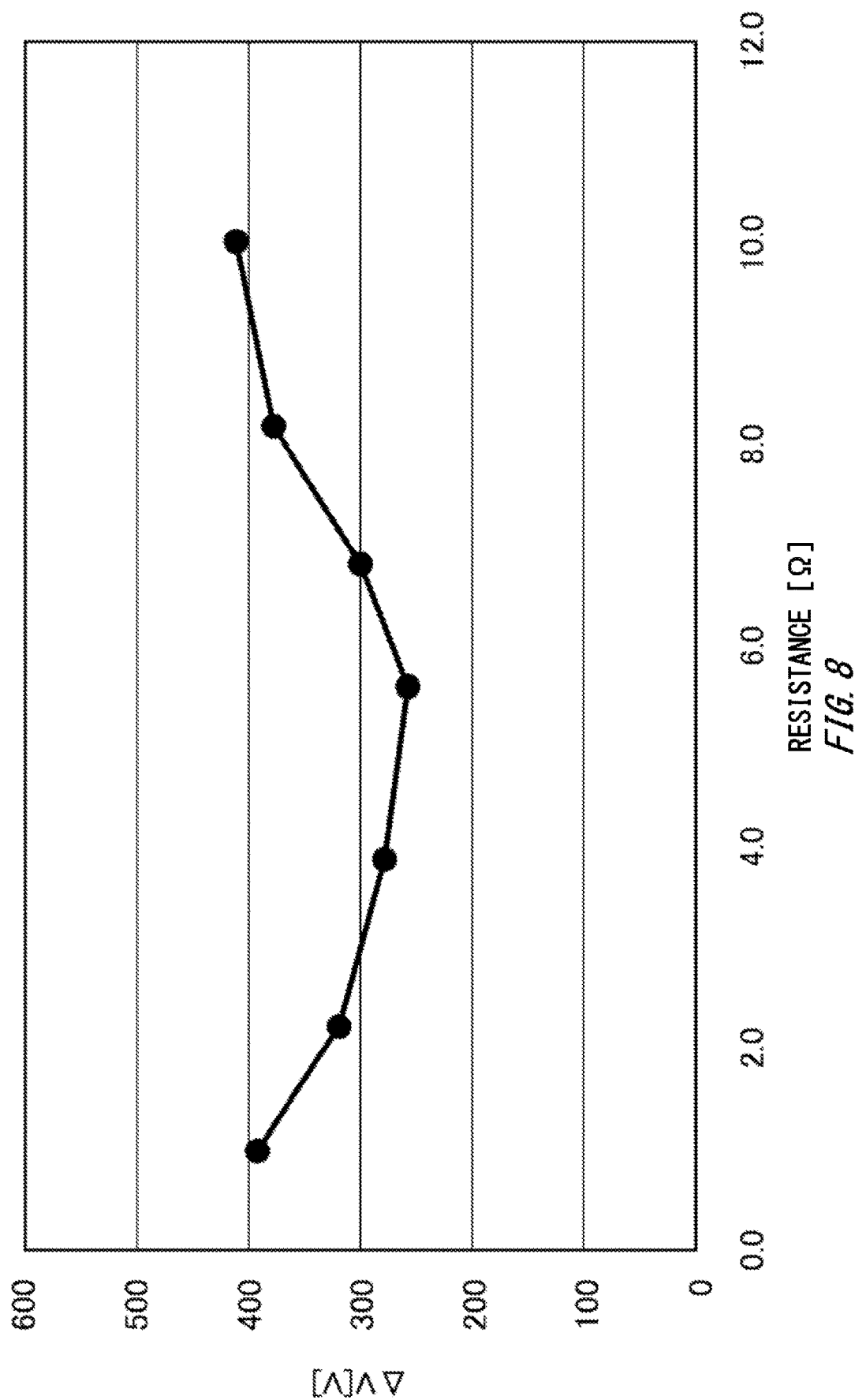
FIG. 8 is a graph showing the change of the surge voltage ΔV with respect to the resistance value of the resistor 54.

FIG. 8 is a graph showing the change of the surge voltage $\Delta V$ with respect to the resistance value of the resistor 54. The graph of the present example shows the change of the surge voltage $\Delta V$ in a case where the resistance value of the resistor 54 is changed from 1.0[Ω] to 10.0[Ω].

By suitably setting the resistance value of the resistor 54, it is possible to reduce the surge voltage $\Delta V$. For example, the surge voltage $\Delta V$ becomes less than or equal to 350 [V] when the resistance value of the resistor 54 is in a range of greater than or equal to 2.0[Ω] and less than or equal to 7.0[Ω]. Accordingly, the ringing can be suppressed by giving the resistor 54 a resistance value that is greater than or equal to 2.0[Ω] and less than or equal to 7.0[Ω].

Figure 9A:
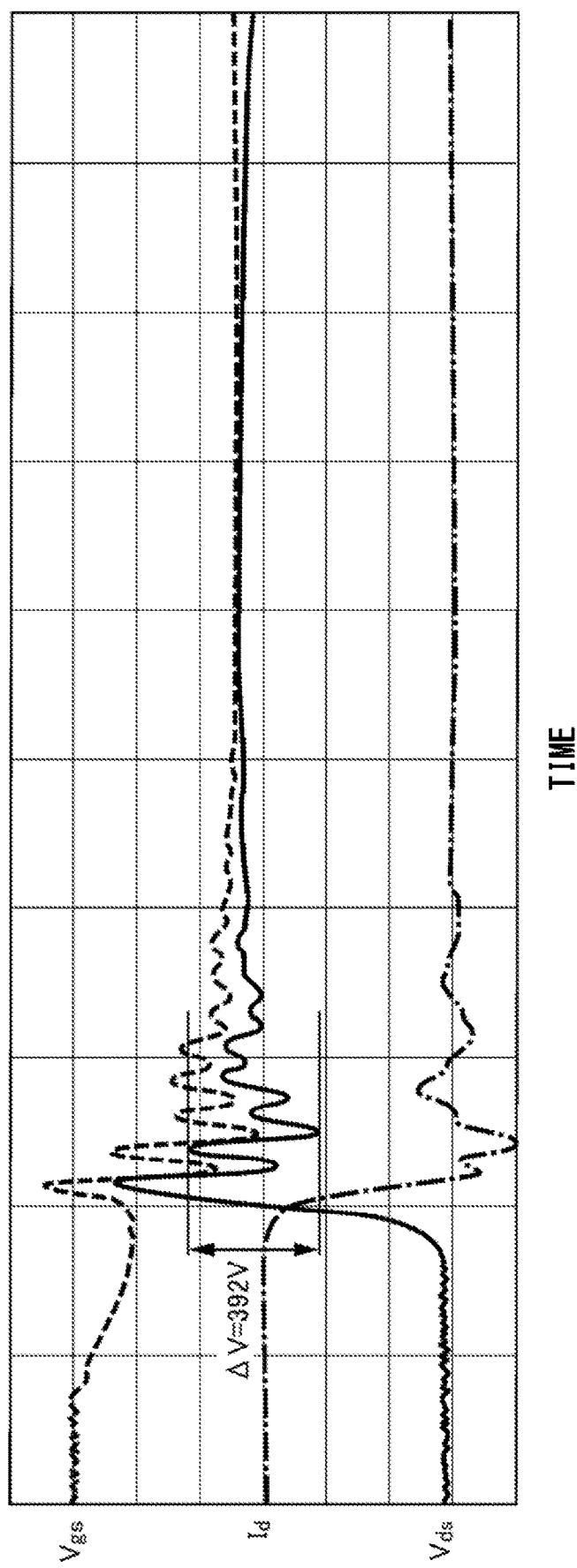
FIG. 9A shows an example of electrical characteristics of the semiconductor device when the semiconductor device is turned OFF.

FIG. 9A shows an example of electrical characteristics of the semiconductor device when the semiconductor device is turned OFF. FIG. 9A shows the change over time of the gate-source voltage $V_{gs}$, the drain-source voltage $V_{ds}$, and the drain current $I_d$.

The capacitor 52 has an electrostatic capacitance of 7.7 [nF]. The resistor 54 has a resistance value of 1.0[Ω]. In a case where an input power supply voltage $V_{cc}$=600 [V] and the drain current $I_d$=300 [A], the surge voltage ΔV of the drain-source voltage $V_{ds}$ is 392 [V].

Figure 9B:
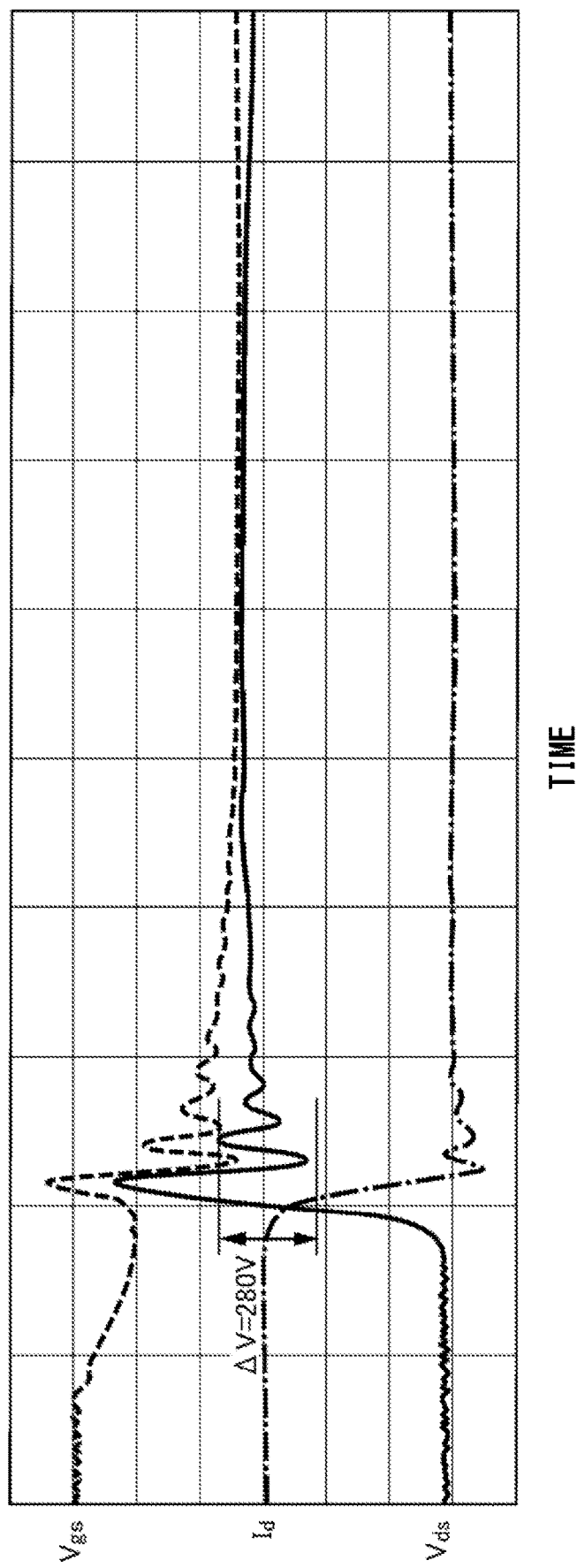
FIG. 9B shows an example of electrical characteristics of the semiconductor device when the semiconductor device is turned OFF.

FIG. 9B shows an example of electrical characteristics of the semiconductor device when the semiconductor device is turned OFF. FIG. 9B shows the change over time of the gate-source voltage $V_{gs}$, the drain-source voltage $V_{ds}$, and the drain current $I_d$.

The capacitor 52 has an electrostatic capacitance of 7.7 [nF]. The resistor 54 has a resistance value of 3.9[Ω]. In a case where the input power supply voltage $V_{cc}$=600 [V] and the drain current $I_d$=300 [A], the surge voltage ΔV of the drain-source voltage $V_{ds}$ is 280 [V].

The semiconductor device 100 suppresses the ringing noise in each of the gate-source voltage $V_{gs}$, the drain-source voltage $V_{ds}$, and the drain current $I_d$. By suitably setting the resistance value of the resistor 54, the semiconductor device 100 can suppress the surge voltage ΔV.

Figure 10:
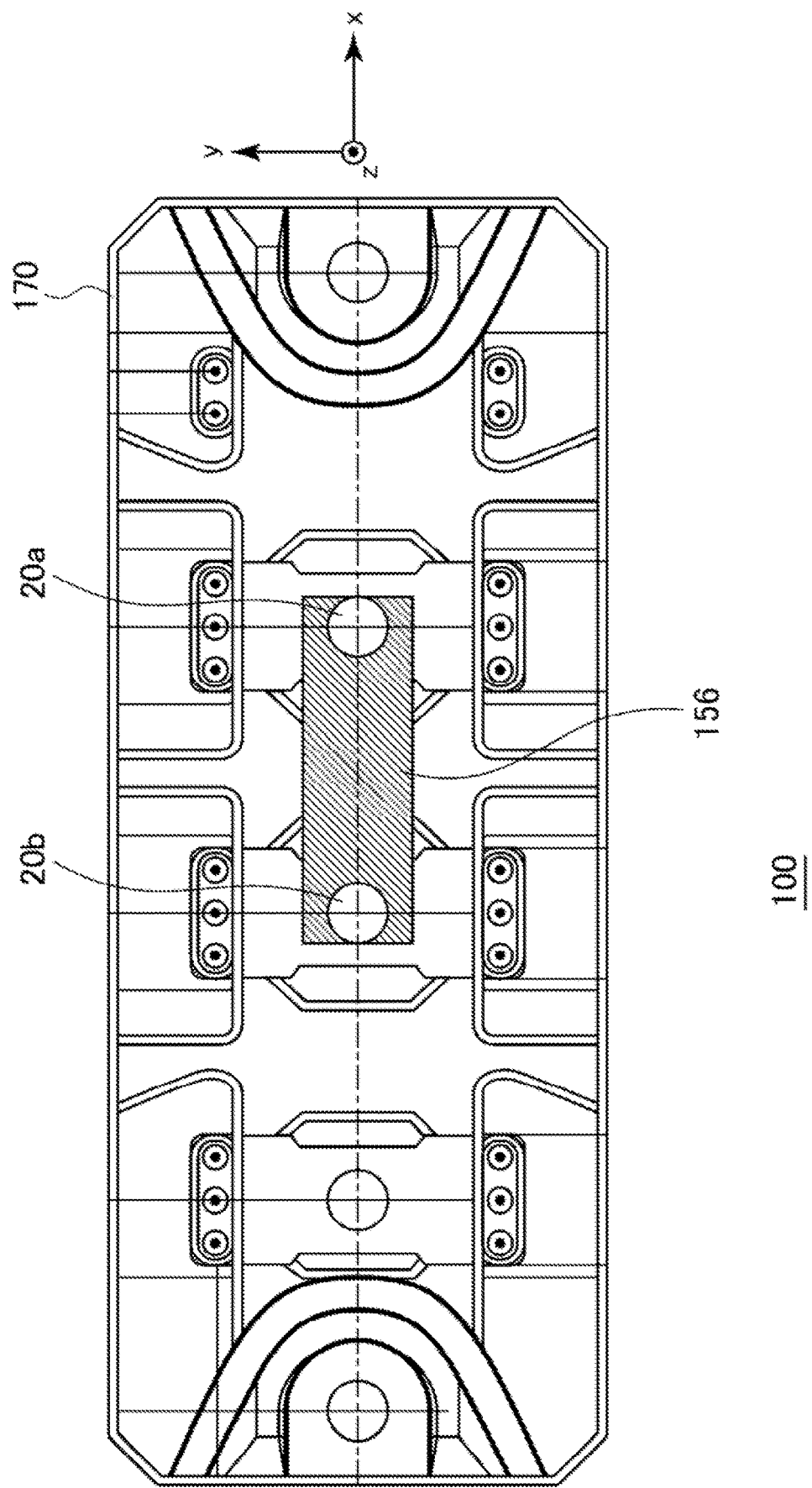
FIG. 10 shows an example of an overhead view of the semiconductor device 100 according to an implementation example.

FIG. 10 shows an example of an overhead view of the semiconductor device 100 according to an implementation example. The capacitor 156 may be fastened to the semiconductor device 100 by each of the input terminal 20a and the input terminal 20b.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

12 . . . insulating board; 14 . . . circuit board; 15 . . . laminated circuit substrate; 20 . . . input terminal; 22 . . . output terminal; 30 . . . power substrate; 32 . . . connecting section; 42 . . . semiconductor chip; 52 . . . capacitor; 54 . . . resistor; 60 . . . bridge substrate; 100 . . . semiconductor device; 131 . . . copper foil; 132 . . . bonding layer; 133 . . . copper board; 140 . . . connection pad; 156 . . . capacitor; 170 . . . case; 500 . . . semiconductor device

What is claimed is:

1. A semiconductor device comprising:
an input terminal including a P terminal and an N terminal;
a laminated circuit substrate connected to the input terminal;
a power substrate provided above the laminated circuit substrate, the input terminal extending through the power substrate and the laminated circuit substrate electrically connected to the power substrate;
a capacitor provided in a conduction path between the P terminal and the N terminal; and
a resistor provided in series with the capacitor in the conduction path between the P terminal and the N terminal.

2. The semiconductor device according to claim 1, wherein
the laminated circuit substrate includes a first laminated circuit substrate connected to the P terminal and a second laminated circuit substrate connected to the N terminal, and
the semiconductor device further comprises:
a first connecting section that electrically connects the first laminated circuit substrate and the power substrate, the first connecting section including the capacitor; and
a second connecting section that electrically connects the second laminated circuit substrate and the power substrate, the second connecting section including the resistor.

3. The semiconductor device according to claim 1, wherein
the capacitor is provided in a region where the N terminal is provided, in the overhead view.

4. The semiconductor device according to claim 3, wherein
the capacitor is layered on the resistor.

5. The semiconductor device according to claim 4, wherein
film thickness of the capacitor is greater than film thickness of the resistor.

6. The semiconductor device according to claim 1, wherein
the laminated circuit substrate further comprises a first laminated circuit substrate connected to the P terminal and a second laminated circuit substrate connected to the N terminal, and
the semiconductor device further comprises:
a first connecting section that electrically connects the first laminated circuit substrate and the power substrate; and
a second connecting section that electrically connects the second laminated circuit substrate and the power substrate, wherein
the capacitor is provided in a region where the first connecting section is provided, in the overhead view, and
the resistor is provided in a region where the second connecting section is provided, in the overhead view.

7. The semiconductor device according to claim 6, wherein
the capacitor and the resistor are provided on the power substrate.

8. The semiconductor device according to claim 1, further comprising a case, wherein
the capacitor and the resistor are provided inside the case.

9. The semiconductor device according to claim 1, wherein
the capacitor is provided closer to the P terminal side than the resistor in the conduction path.

10. The semiconductor device according to claim 1, wherein
the capacitor has an electrostatic capacitance that is greater than or equal to 1.0 [nF] and less than or equal to 8.0 [nF].

11. The semiconductor device according to claim 1, wherein
the resistor has a resistance value that is greater than or equal to 2.0 [Ω] and less than or equal to 7.0 [Ω].

12. The semiconductor device according to claim 1, wherein
 the capacitor is provided in a region where the input terminal is provided, in an overhead view.

\* \* \* \* \*